US009135966B2

(12) United States Patent
Iwamoto et al.

(10) Patent No.: US 9,135,966 B2
(45) Date of Patent: Sep. 15, 2015

(54) SEMICONDUCTOR DEVICE INCLUDING MEMORY CAPABLE OF REDUCING POWER CONSUMPTION

(75) Inventors: Hisashi Iwamoto, Kawasaki (JP); Yuji Yano, Kawasaki (JP); Kazunari Inoue, Kawasaki (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 268 days.

(21) Appl. No.: 13/566,779

(22) Filed: Aug. 3, 2012

(65) Prior Publication Data
US 2013/0039134 A1 Feb. 14, 2013

(30) Foreign Application Priority Data

Aug. 9, 2011 (JP) .................................. 2011-174011

(51) Int. Cl.
*G11C 7/00* (2006.01)
*G11C 7/22* (2006.01)
*G11C 7/10* (2006.01)

(52) U.S. Cl.
CPC ............ *G11C 7/1069* (2013.01); *G11C 7/1006* (2013.01); *G11C 7/1096* (2013.01); *G11C 7/222* (2013.01)

(58) Field of Classification Search
CPC ..... G11C 7/1069; G11C 7/222; G11C 7/1006
USPC ............... 365/185.11, 189.14, 230.03, 233.1, 365/233.19, 236
See application file for complete search history.

(56) References Cited

U.S. PATENT DOCUMENTS

| 5,384,745 A | * | 1/1995 | Konishi et al. ........... 365/230.03 |
| 6,704,237 B2 | * | 3/2004 | Park .............................. 365/226 |
| 2002/0026543 A1 | | 2/2002 | Tojima et al. |

FOREIGN PATENT DOCUMENTS

| JP | 58-68129 A | 4/1983 |
| JP | 02-137041 A | 5/1990 |
| JP | 02-292929 A | 12/1990 |
| JP | 11-250658 A | 9/1999 |
| JP | 2002-207541 A | 7/2002 |
| JP | 2003-248652 A | 9/2003 |
| JP | 2005-196343 A | 7/2005 |
| JP | 2007-200213 A | 8/2007 |

OTHER PUBLICATIONS

Japanese Office Action Issued in Japanese Patent Application No. 2011-174011 Mailed November 18, 2014, With English Translation.

* cited by examiner

*Primary Examiner* — Thao H Bui
(74) *Attorney, Agent, or Firm* — McDermott Will & Emery LLP

(57) ABSTRACT

A semiconductor device includes a plurality of memory arrays and a plurality of memory array control circuits. Each of the plurality of memory array control circuits includes a read/write control circuit for controlling a read/write operation for the memory array, and a selection circuit for selecting and activating the memory array based on a clock signal and an output signal from the read/write control circuit.

8 Claims, 15 Drawing Sheets

100C

SEMICONDUCTOR DEVICE INCLUDING MEMORY CAPABLE OF REDUCING POWER CONSUMPTION

BACKGROUND OF THE INVENTION

1. Field of the Invention

The present invention relates to a semiconductor device, and more particularly to a semiconductor device including a memory capable of reducing power consumption.

2. Description of the Background Art

Recently, the network increasingly becomes fast, so that a communication terminal such as a rooter or a switch needs to respond to its speed. In general, as for the communication terminal such as the rooter or switch, a memory such as a packet buffer is always put in an activated state (activated) even when a band of communication data considerably differs in height, and the band is low.

In addition, in tandem with the increase in speed of the network, there is an increase in data transfer rate of a network processor and the packet buffer, so that capacity of the memory used as the packet buffer needs to be higher. Thus, in order to respond to the increase in speed of the network, a memory needs to be high in speed and high in capacity.

In order to solve the above problem, the following technique is known.

According to Japanese Patent Laying-Open No. 2003-248652, it is an object to provide a low power consumption and high performance DMA controller that can provide a DMA request with priority and a parameter such as timing information and cancel information, reserve the parameter in advance, and execute DMA transfer according to the set parameter, and that is small in circuit scale, easy to design, and excellent in data transfer efficiency. A main memory used to store various kinds of data is physically divided into a plurality of regions, and a clock is supplied to each of the regions. In addition, a data transfer controller is provided with a clock controller and an address determination unit. Thus, among the physically divided regions, the clock and a control signal are supplied only to the region selected by the address determination unit, and the clock and the control signal are not supplied to the unselected region.

According to Japanese Patent Laying-Open No. 2002-207541, it is an object to accurately reduce power consumption of a system without considering an interrupt level. A bus controller includes access decision means for deciding a period during which no access occurs to a device, and control signal generation means capable of generating a signal for shifting the device to a low-power-consumption mode in the period during which no access occurs to the device, based on the decided result of the access decision means. The power consumption of the system can be properly reduced by shifting the device to the low-power-consumption mode in the period during which no access occurs to the device to reduce the power consumption in the device.

According to Japanese Patent Laying-Open No. 11-250658, it is an object to realize low power consumption of a semiconductor device by active/inactive control of an internal timing clock signal. A clock synchronous semiconductor device for interpreting chip-selected and supplied commands includes means for generating a first timing clock signal for operating a command interpreting circuit and means for generating a second timing clock signal for operating inner circuits according to the command interpret result. In a chip-unselected state, no circuit operation of the command interpret system is needed, so that the generating means performs the clock signal generating operation in the chip-selected state and stops the clock signal generating operation in the chip-unselected state to contribute to the low power consumption. The semiconductor device performs the internal operation according to commands even in the chip-unselected state and the generating means continues the clock signal generating operation even in the chip-unselected state to ensure a normal operation of the semiconductor device.

However, according to the inventions disclosed in Japanese Patent Laying-Open No. 2003-248652, and Japanese Patent Laying-Open No. 2002-207541, a memory having a low-power-consumption memory controller is not described in detail. In addition, according to the invention disclosed in Japanese Patent Laying-Open No. 11-250658, a detailed description is not given of an operation for controlling supply of a clock signal or a power supply with a changing load and a data capacity value.

Other object and new features will become more apparent from the description of this specification and accompanying drawings.

SUMMARY OF THE INVENTION

A semiconductor device in one embodiment includes a plurality of memory arrays and a plurality of memory array control circuits. Each of the plurality of memory array control circuits includes a read/write control circuit for controlling a read/write operation for the memory array, and a selection circuit for selecting and activating the memory array based on a clock signal and an output signal from the read/write control circuit.

According to the one embodiment, the memory array is controlled to be activated/inactivated based on the presence of the effective data, and the clock signal or the power supply is not supplied to the inactivated memory array, so that the power consumption can be reduced.

The foregoing and other objects, features, aspects and advantages of the present invention will become more apparent from the following description of the present invention when taken in conjunction with the accompanying drawings.

DESCRIPTION OF THE PREFERRED EMBODIMENTS

Figure 1:
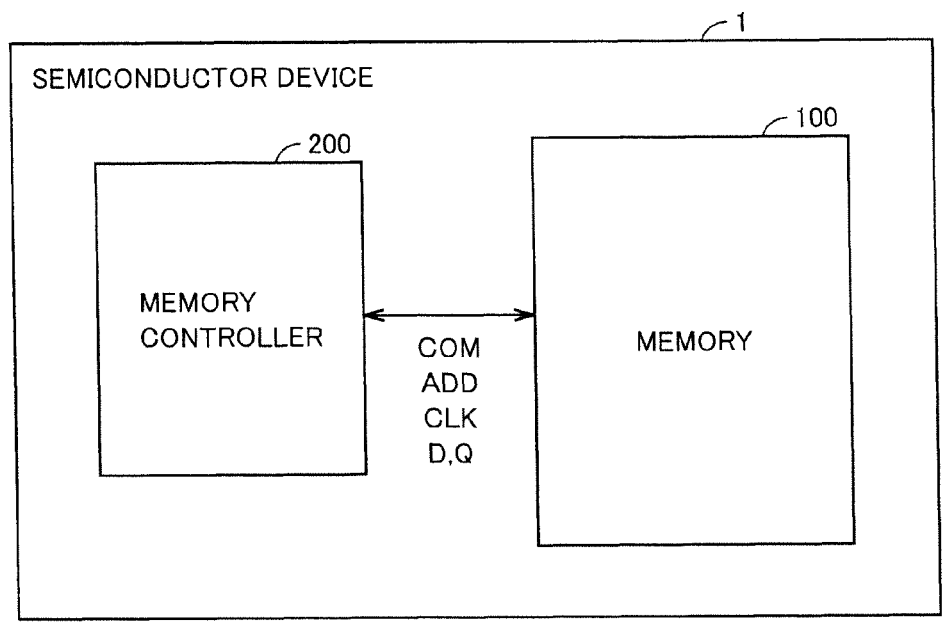
FIG. 1 is a block diagram showing a configuration of a semiconductor device 1.

Hereinafter, the present invention will be described in detail with reference to the drawing. In addition, the same or corresponding part in the drawing is marked with the same reference and its description is not given.

First Embodiment

FIG. 1 is a block diagram showing a configuration of a semiconductor device 1. Referring to FIG. 1, semiconductor device 1 includes a memory 100 and a memory controller 200. Memory controller 200 applies a control signal such as a command signal COM, an address signal ADD, or a clock signal CLK, to memory 100 in order to control memory 100. Memory 100 is controlled based on this control signal.

In a case where a write operation is performed in a memory cell of memory 100, a data input signal D is applied thereto together with command signal COM. Meanwhile, in a case where a read operation is performed to read data from the memory cell of memory 100, the data read from the memory cell is outputted as a data output signal Q.

Figure 2:
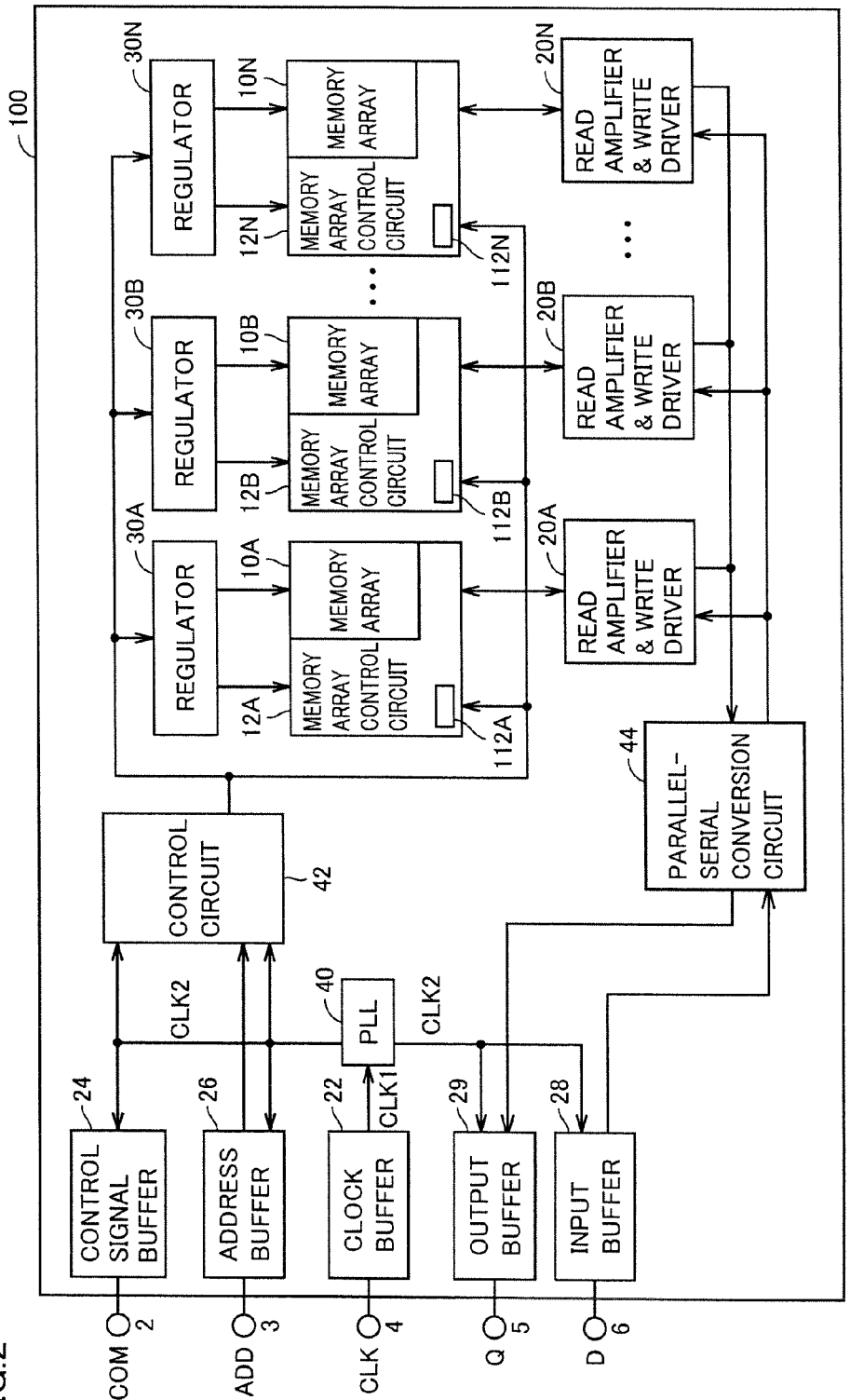
FIG. 2 is a block diagram schematically sowing a configuration of a memory 100 provided in semiconductor device 1.

FIG. 2 is a block diagram schematically showing a configuration of memory 100 provided in semiconductor device 1. Referring to FIG. 2, memory 100 includes a clock terminal 4, a control signal terminal 2, an address terminal 3, a data input terminal 6, and a data output terminal 5.

In addition, memory 100 includes a clock buffer 22, a control signal buffer 24, an address buffer 26, an input buffer 28 for data input signal D, and an output buffer 29 for data output signal Q.

In addition, memory 100 includes a control circuit 42, memory arrays 10A, 10B, . . . , 10N (hereinafter, collectively referred to as a memory array 10 occasionally), memory array control circuits 12A, 12B, . . . , 12N (hereinafter, collectively referred to as a memory array control circuit 12 occasionally).

In addition, memory array control circuits 12 include read/write control circuits 112A, 112B, . . . , 112N (hereinafter, collectively referred to as a read/write control circuit 112 occasionally). As will be described in FIG. 3 below, read/write control circuit 112 determines whether or not data exists in memory array 10 and whether or not the data will be read or could be read. In addition, data which satisfies the above conditions is referred to as effective data.

Furthermore, memory array control circuits 12 include selection circuits 14A, 14B, . . . , 14N (hereinafter, referred to as a selection circuit 14 occasionally) (not shown) provided. Selection circuit 14 will be further described with reference to FIGS. 7 to 10, and 12.

In addition, memory 100 includes read amplifier & write drivers 20A, 20B, . . . , 20N (hereinafter, collectively referred to as a read amplifier & write driver 20 occasionally), regulators 30A, 30B, . . . , 30N (hereinafter, collectively referred to as a regulator 30 occasionally), a PLL circuit 40, and a parallel-serial conversion circuit 44.

Regulator 30 is provided in order to stabilize a power supply voltage at the time of read/write operation. Clock terminal 4 receives clock signal CLK, and applies clock signal CLK to clock buffer 22.

Control signal terminal 2 receives command signal COM serving as a signal used for controlling the memory. For example, control signal terminal 2 can receive a command control signal such as a chip select signal /CS, a row address strobe signal /RAS, a column address strobe signal /CAS, a write enable signal /WE, or a write mask signal DM.

Address terminal 3 receives address signal ADD. For example, address terminal 3 can receive bank address signals BA0 and BA1 other than address signal ADD.

Clock buffer 22 receives clock signal CLK and generates a clock signal CLK1, and generated clock signal CLK1 is applied to PLL circuit 40. PLL circuit 40 receives clock signal CLK1 as an input signal, and generates a high-frequency clock signal CLK2 which is synchronized with the input signal. Clock signal CLK2 is applied to control signal buffer 24, address buffer 26, input buffer 28, and output buffer 29.

Control signal buffer 24 fetches and latches chip select signal /CS, row address strobe signal /RAS, column address strobe signal /CAS, and write enable signal /WE in synchronization with clock signal CLK2 outputted from PLL circuit 40, and outputs internal control signals corresponding to respective signals, to control circuit 42.

Address buffer 26 fetches and latches address signal ADD in synchronization with clock signal CLK2 outputted from clock buffer 22, and generates and outputs an internal address signal to control circuit 42.

Data input terminal 6 and data output terminal 5 exchange data read from and written in memory 100 with an external part, respectively. Data input terminal 6 receives data Dj (j is a natural number of 0 to 7, for example) from the external part at the time of data writing, and data output terminal 5 outputs data Qj (j is a natural number of 0 to 7, for example) to the external part at the time of data reading. Input buffer 28 and output buffer 29 operate in synchronization with clock signal CLK2 generated by PLL circuit 40.

Control circuit 42 generates an internal control command based on the internal control signal outputted from control signal buffer 24. Thus, the internal control command signal outputted from control circuit 42 is applied to memory array control circuit 12, and regulator 30. Consequently, data Dj is read from and written in memory array 10. As for memory array 10 used for storing the data, the data is read/written through a sense amplifier (not shown).

Figure 3:
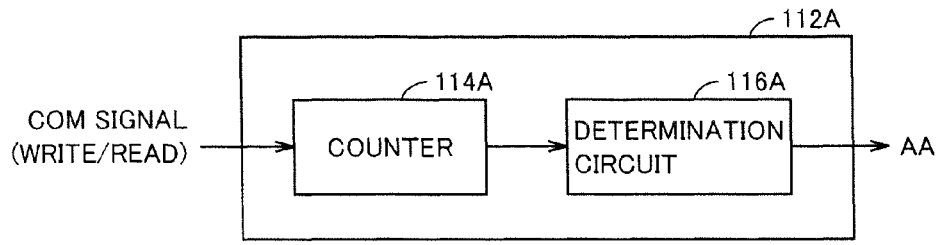
FIG. 3 is a block diagram showing one example of a configuration of a read/write control circuit 112A.

FIG. 3 is a block diagram showing one example of a configuration of read/write control circuit 112A. Referring to FIG. 3, read/write control circuit 112A includes a counter 114A and a determination circuit 116A.

Counter 114A receives a write command signal or a read command signal as an input signal. Counter 114A increments the counter number by one when the write command signal is applied. Meanwhile, counter 114A decrements the counter number by one when the read command signal is applied. Counter 114A increments or decrements the counter number, and outputs it to determination circuit 116A.

Based on the outputted count signal, determination circuit 116A outputs a high-level signal, that is, H level signal as a signal AA when the effective data exists in memory array 10A.

In the case where the effective data exits, the counter number shows the number more than 0. That is, since written data is more than the read data, it is determined that the effective data is still stored in the memory array and could be read. In this case, determination circuit 116A outputs the H level output signal as signal AA.

In addition, in a case where the counter number is less than 0, it is determined that there is no effective data by determination circuit 116A, and determination 116A outputs a L level output signal as signal AA.

Since read/write control circuits 112B, . . . , 112N have the same configuration, a description therefor is not given. In addition, hereinafter, counters 114A, . . . , 114N are collectively referred to as a counter 114, and determination circuits 116A, . . . , 116N are collectively referred to as a determination circuit 116.

Figure 4:
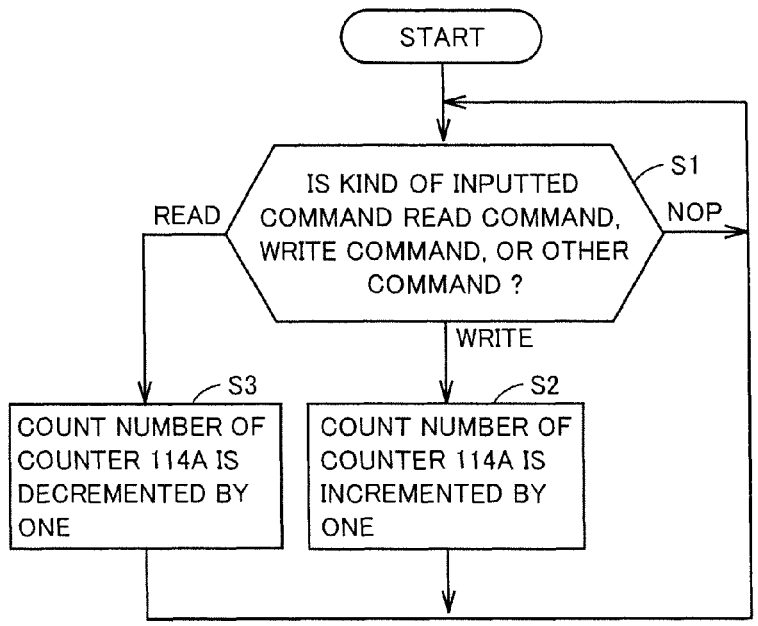
FIG. 4 is a flowchart to describe an operation of a counter 114A.

FIG. 4 is a flowchart to describe an operation of counter 114A. Referring to FIG. 4, when the read operation or write operation to the memory array is commanded by a user, it is determined whether the inputted command is a read command showing the read operation from the memory array, a write command showing the write operation to the memory array, or a command other than the above two commands, in step S1.

When it is determined that the inputted command is the read command, the process proceeds to step S3. In step S3, the count of counter 114A is decremented by one, and the process returns to step S1.

In addition, when it is determined that the inputted command is the write command, the process proceeds to step S2. In step S2, the count of counter 114A is incremented by one, and the process returns to step S1.

In addition, when it is determined that the inputted command is other than the above commands, the count of counter 114A is not changed, and the process returns to step S1.

In the above, the description has been given of counter 114A provided in read/write control circuit 112A, but the above operations are similarly performed for counter 114 in read/write control circuit 112.

Hereinafter, in order to facilitate understanding of the first embodiment, a description will be given of memory arrays 10A to 10D.

Figure 5:
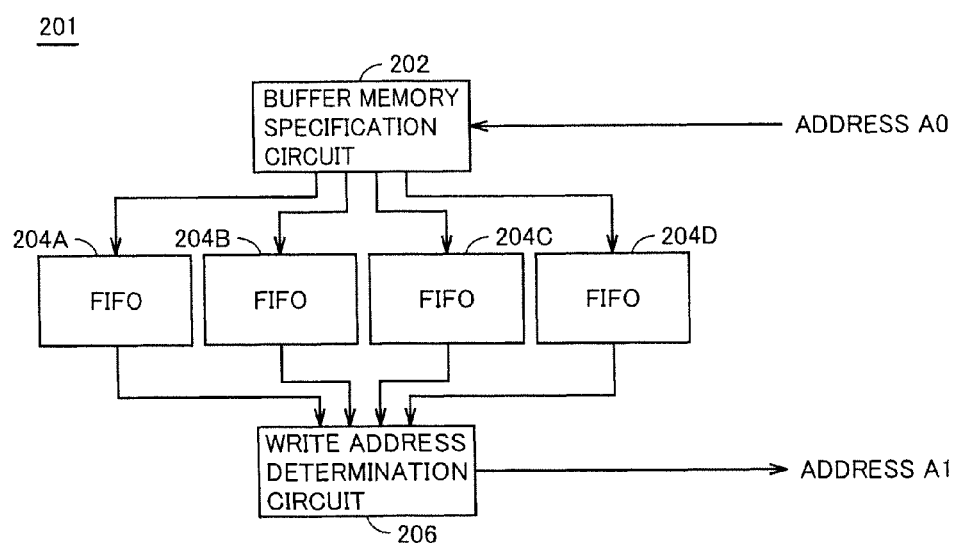
FIG. 5 is a schematic view showing one example of a configuration of an address management circuit 201 provided in a memory controller 200 in FIG. 1.

FIG. 5 is a schematic view showing one example of a configuration of an address management circuit 201 provided in memory controller 200. Referring to FIG. 5, address management circuit 201 includes a buffer memory specification circuit 202, FIFO (First-In/First-Out) memories 204A to 204D, and a write address determination circuit 206. In addition, inputs/outputs of FIFO memories 204A to 204D are performed independently.

In general, when data is written in the memory cell, a logical address of the memory cell is changed into a physical address, and an address management is also performed at the same time. At this time, the data to be written is written in the memory cell in which data is not actually written in the memory.

According to the first embodiment, the address management is performed by FIFO memories 204A to 204D provided in address management circuit 201. For example, after the data written in the memory cell has been read, in a case where the data written in the memory cell is not used as the effective data, an address A0 corresponding to this memory cell is stored in one of FIFO memories 204A to 204D by buffer memory specification circuit 202 in address management circuit 201. At this time, buffer memory specification circuit 202 makes a determination based on a low-order address of address A0.

For example, in a case where address A0 specifies the memory cell of a memory array B, address A0 is stored in FIFO memory 204B corresponding to memory array B.

In the case where the write operation is to be performed in the memory cell, an address A1 stored in one of FIFO memories 204A to 204D is specified and outputted by write address determination circuit 206. For example, write address determination circuit 206 outputs address A1 stored in FIFO memory 204C, the data is written in the memory cell of a memory array C specified by address A1.

Through the read operation, the address information of the memory cell which does not function as the effective data anymore is stored in one of FIFO memories 204A to 204D corresponding to the memory array of that memory cell as a null address.

Through the write operation, the address information stored in FIFO memories 204A to 204D is read from FIFO memories 204A to 204D by write address determination circuit 206 and used.

Therefore, in the case where an address corresponding to memory array 10A exists in FIFO memory 204A, this address is used as matter of a first priority, and in the case where the address does not exist in FIFO memory 204A, an address corresponding to memory array 10B is used as a matter of second priority, and in the case where the address does not exist, an address corresponding to memory array 10C is used as a matter of third priority. In this way, the effective data is more likely to exist in memory array 10A, and the effective data becomes less likely to exist in memory arrays 10B, 10C, and 10D in this order. That is, a period during which memory arrays 10B to 10D are halted can be increased, so that power consumption can be reduced as a whole.

Figure 6:
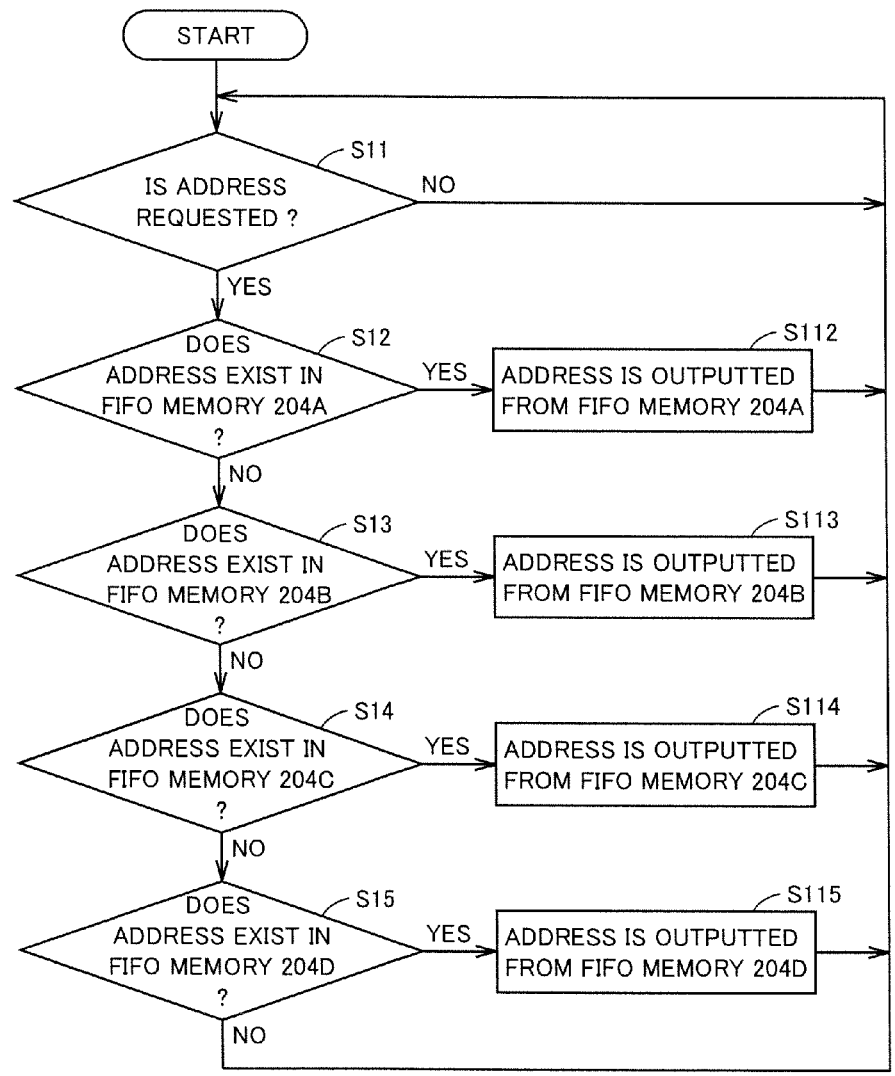
FIG. 6 is a flowchart to describe management control of address information.

FIG. 6 is a flowchart to describe management control of the address information. Referring to FIG. 6, when a command is inputted by the user, it is determined whether or not an address request is made on write address determination circuit 206 in step S11. In a case where the inputted command is the write command, the address of the memory cell in which data is to be written is needed. When it is determined that the address request is made on the write address determination circuit 206, the process proceeds to step S12. Meanwhile, when it is determined that the address request is not made on the write address determination circuit 206, the process returns to step S11.

In step S12, write address determination circuit 206 determines whether or not the address is stored in FIFO memory 204A. When it is determined that the address exists in FIFO memory 204A, the process proceeds to step S112, and the address stored in FIFO memory 204A is outputted to memory 100 in step S112. Meanwhile, when it is determined that the address does not exist in FIFO memory 204A, the process proceeds to step S13, and it is further determined whether or not the address is stored in FIFO memory 204B.

In step S13, write address determination circuit 206 determines whether or not the address is stored in FIFO memory 204B. When it is determined that the address exists in FIFO memory 204B, the process proceeds to step S113, and the address stored in FIFO memory 204B is outputted to memory 100 in step S113. Meanwhile, when it is determined that the address does not exist in FIFO memory 204B, the process proceeds to step S14, and it is further determined whether or not the address is stored in FIFO memory 204C.

In step S14, write address determination circuit 206 determines whether or not the address is stored in FIFO memory 204C. When it is determined that the address exists in FIFO memory 204C, the process proceeds to step S114, and the address stored in FIFO memory 204C is outputted to memory 100 in step S114. Meanwhile, when it is determined that the address does not exist in FIFO memory 204C, the process proceeds to step S15, and it is further determined whether or not the address is stored in FIFO memory 204D.

In step S15, write address determination circuit 206 determines whether or not the address is stored in FIFO memory 204D. When it is determined that the address exists in FIFO memory 204D, the process proceeds to step S115, and the address stored in FIFO memory 204D is outputted to memory 100 in step S115. Meanwhile, when it is determined that the address does not exist in FIFO memory 204D, the process returns to step S11 again, and determinations are made in steps S11 to S15.

Figure 7:
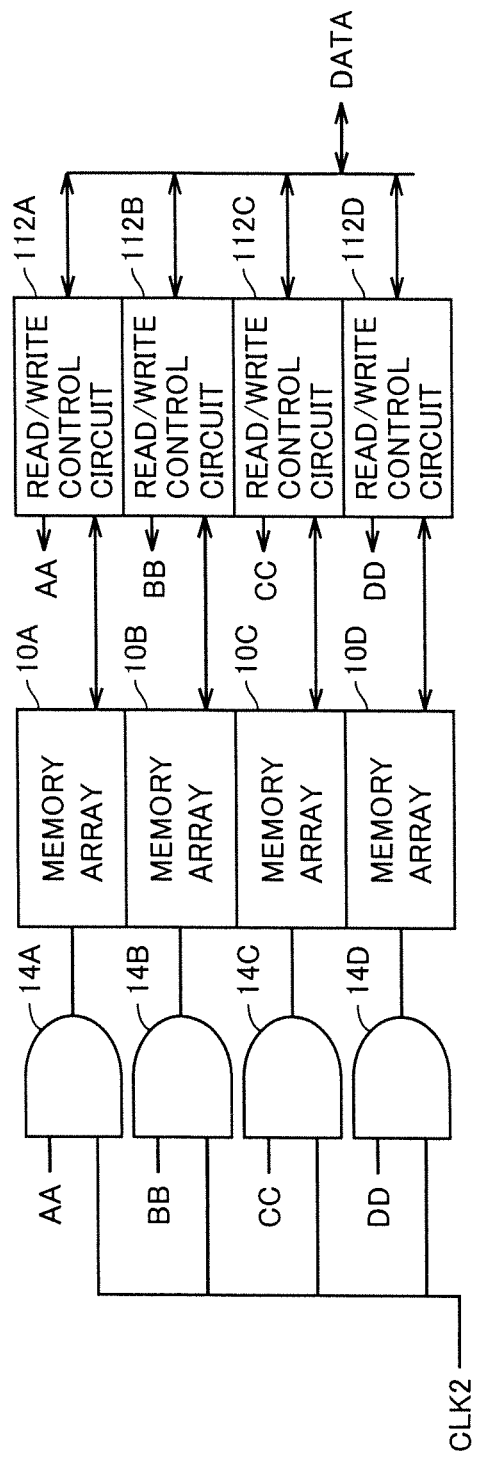
FIG. 7 is a block diagram showing a part of memory 100 to describe operations of a memory array and the read/write control circuit provided in memory 100.

FIG. 7 is a block diagram showing a part of memory 100 to describe operations of the memory array and the read/write control circuit in memory 100. In order to facilitate a description, a description will be given of memory arrays 10A to 10D.

Referring to FIG. 7, memory 100 includes 2-input AND circuits 14A to 14D provided as selection circuits 14 and read/write control circuits 112A to 112D, with respect to memory arrays. That is, memory 100 includes memory arrays 10A to 10D, 2-input AND circuits 14A to 14D serving as logic gates, and read/write control circuits 112A to 112D, 2-input AND circuits 14A to 14D and read/write control circuits 112A to 112D. Here, the 2-input AND circuit is used for selection circuit 14, but it is not limited thereto.

Signals AA to DD are applied from read/write control circuits 112A to 112D to first input terminals of 2-input AND circuits 14A to 14D, respectively and common clock signal CLK2 is applied to second input terminals thereof.

In order to facilitate understanding, a specific description will be given of memory array 10A, as an example. Read/write control circuit 112A determines whether or not the effective data is written in memory array 10A, and determines whether or not memory array 10A is used.

More specifically, in the case where the effective data exists therein, H level signal AA is applied to the first input terminal of 2-input AND circuit 14A, while in the case where the effective data does not exist therein, L level signal AA is applied to the first input terminal of 2-input AND circuit 14A. Meanwhile, common clock signal CLK2 is applied to the second input terminal of 2-input AND circuit 14A.

Thus, in the case where H level signal AA is inputted, memory array 10A is supplied with clock signal CLK2 and activated. Meanwhile, in the case where L level signal AA is inputted, the output signal of 2-input AND circuit 14A becomes L level, and the clock signal is not supplied thereto, so that memory array 10A is inactivated.

The description has been given of the clock signal as one example, but the supply of the power supply to memory array 10A may be controlled by signal AA similarly. That is, in a case where H level signal AA is inputted, the power supply is supplied to memory array 10A, and in a case where L level signal AA is inputted, the power supply is not supplied to memory array 10A.

More specifically, only in the case where the effective data exists in memory array 10A, clock signal CLK2 is applied thereto, and the memory cell of memory array 10A is subjected to a refresh operation, and the effective data is kept stored in the memory cell.

On the contrary, in the case where the effective data does not exist in memory array 10A, clock signal CLK2 or the power supply is not supplied, so that the power consumption to the memory array not having the effective data can be reduced.

In addition, since the same control is applied to memory arrays 10B to 10D, a description therefor is not given.

Consideration Example

Figure 8:
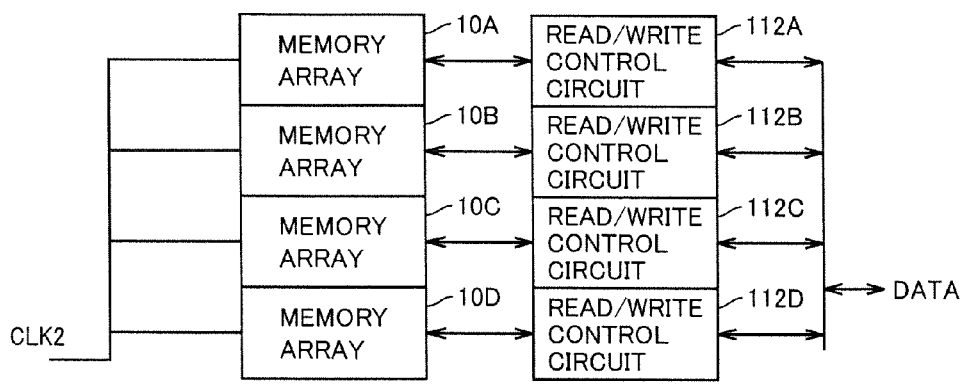
FIG. 8 is a block diagram showing a part of a memory 100X to describe operations of a memory array and a read/write control circuit in a consideration example.

FIG. 8 is a block diagram showing a part of a memory 100X to describe operations of a memory array and a read/write control circuit in a consideration example. Referring to FIGS. 7 and 8, memory 100X in the consideration example will be described, while making a comparison with memory 100 in the first embodiment.

Memory 100X in the consideration example has a configuration in which selection circuit 14 (2-input AND circuits 14A to 14D) are not provided, while being compared with the configuration of memory 100 in the first embodiment.

Therefore, clock signal CLK2 is directly applied to each of memory arrays 10A to 10D. In this consideration example, clock signal CLK2 is always applied to each of memory arrays 10A to 10D.

However, in this configuration, since clock signal CLK2 or the power supply is also supplied to the memory array having unnecessary data, the power consumption is increased.

Therefore, memory 100 provided in semiconductor device 1 in the embodiment shown in FIG. 1 does not have the configuration in which clock signal CLK2 is supplied to each of the memory arrays like the consideration example. Instead, memory 100 includes read/write control circuit 112 and 2-input AND circuits 14A to 14D, so that the power consumption for the unnecessary memory array can be reduced.

First Variation of First Embodiment

Figure 9:
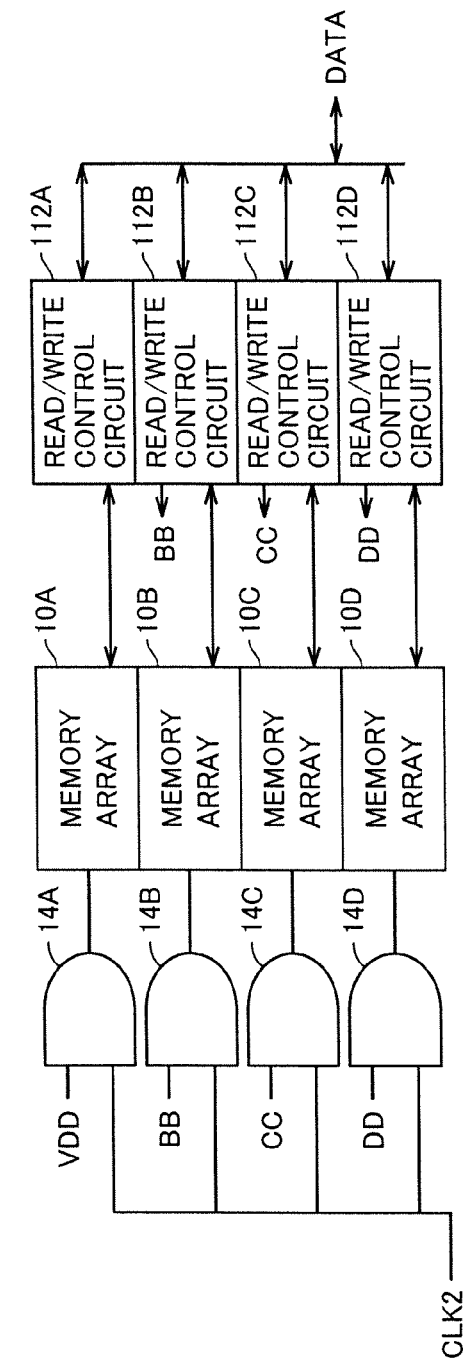
FIG. 9 is a block diagram showing a part of a memory 100A to describe operations of a memory array and a read/write control circuit in a first variation of a first embodiment.

FIG. 9 is a block diagram showing a part of a memory 100A to describe operations of a memory array and a read/write control circuit in a first variation of the first embodiment.

Referring to FIGS. 1, 7, and 9, a description will be given of memory 100A of the first variation of the first embodiment, while making a comparison with memory 100 of the first embodiment.

Compared with the configuration of memory 100, according to memory 100A, signal AA outputted from read/write control circuit 112A in FIG. 7 is not outputted to 2-input AND circuit 14A, but a signal VDD fixed to H level is only applied to a first input terminal of 2-input AND circuit 14A, and output signals BB to DD of read/write control circuits 112B to 112D are applied to first input terminals of 2-input AND circuits 14B to 14D, respectively. In addition, signal VDD fixed to H level is used here, but it is not necessarily fixed to H level as long as a signal has a signal level to activate the memory array.

In this configuration, memory array 10A is always supplied with clock signal CLK2 or the power supply and activated, and memory array 10A is preferentially selected as the memory array in which data is to be written. Thus, the memory can be efficiently used. Meanwhile, the supply of clock signal CLK2 or the power supply to unused memory arrays 10B to 10D can be stopped and memory arrays 10B to 10D are inactivated, so that the power consumption can be reduced.

In addition, in a case where a memory is designed normally, the configuration in the first variation of the first embodiment is provided because each designed circuit is repeatedly used many times, but clock signal CLK2 may be directly applied to memory array 10A without passing through 2-input AND circuit 14A.

Second Variation of First Embodiment

Figure 10:
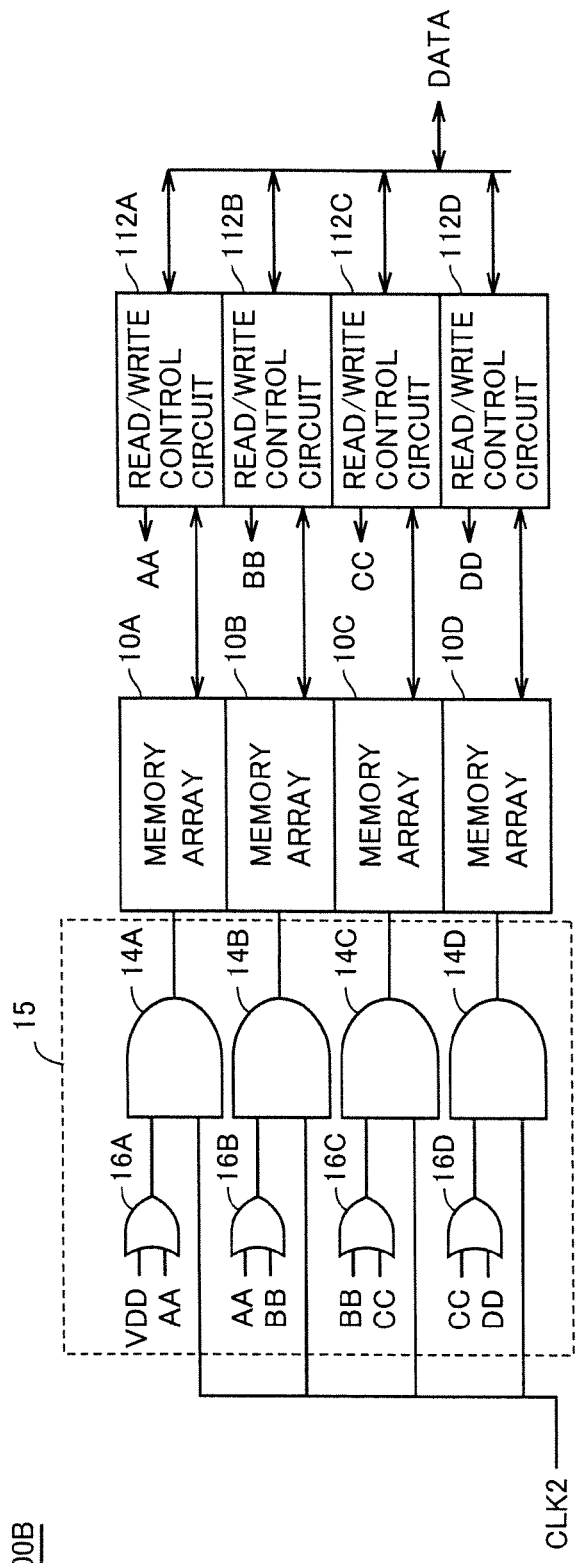
FIG. 10 is a block diagram showing a part of a memory 100B to describe operations of a memory array and a read/write control circuit in a second variation of the first embodiment.

FIG. 10 is a block diagram showing a part of a memory 100B to describe operations of a memory array and a read/ write control circuit in a second variation of the first embodiment. In the second variation of the first embodiment, a description will be given of a case where data is preferentially written in memory array 10A, and memory array 10B, memory array 10C, and then memory array 10D are used in this order.

Referring to FIGS. 1, 7, and 10, memory 100B of the second variation of the first embodiment will be described, while making a comparison with memory 100 of the first embodiment.

According to memory 100B, a selection circuit 15 is added in the configuration of memory 100 instead of selection circuit 14. Selection circuit 15 includes selection circuit 14, and a selection circuit 16. As selection circuit 14, 2-input AND circuits 14A to 14D serving as logic gates are provided, and as selection circuit 16, 2-input OR circuits 16A to 16D serving as logic gates are provided. Here, selection circuit 15 includes selection circuit 14 and selection circuit 16, but the present invention is not limited to this.

Signal VDD (H level), a signal AA, a signal BB, and a signal CC are applied to first input terminals of 2-input OR circuits 16A to 16D, respectively. Meanwhile, signal AA, signal BB, signal CC, and signal DD are applied to second input terminals of 2-input OR circuits 16A to 16D, respectively. In addition, signals AA to DD show output signals of read/write control circuits 112A to 112D, respectively.

Output signals of 2-input OR circuits 16A to 16D are applied to first input terminals of 2-input AND circuits 14A to 14D, respectively, and common clock signal CLK2 is applied to second input terminals of 2-input AND circuits 14A to 14D.

For example, in a case where the effective data exists only in memory array 10A, signal AA serving as the output of read/write control circuit 112A becomes H level. Therefore, signal AA (H level) is applied to the first input terminal of 2-input OR circuit 16A, and signal VDD (H level) is applied to the second input terminal thereof, so that 2-input OR circuit 16A outputs an H level signal. Since the H level signal is applied to each of the first and second input terminals of 2-input AND circuit 14A, clock signal CLK2 or the power supply is supplied to memory array 10A, and memory array 10A is activated.

The above operations are the same as those in the first variation of the first embodiment. However, according to the second variation of the first embodiment, signal AA is applied to the first input terminal of 2-input OR circuit 16B that controls memory array 10B. Thus, when signal AA is at H level, the signal outputted from 2-input OR circuit 16B is at H level regardless of the signal level applied to the second input terminal of 2-input OR circuit 16B. Therefore, the H level output signal is applied to the first input terminal of 2-input AND circuit 14B, and H level clock signal CLK2 is applied to the second input terminal thereof, so that memory array 10B is activated.

Then, as for memory array 10C, since signals BB and CC applied to the first and second input terminals of 2-input OR circuit 16C which controls memory array 10C are at L level, memory array 10C is inactivated.

However, when capacity of memory array 10A runs out, and data is written in memory array 10B, signal BB outputted from read/write control circuit 112B becomes H level at the same time, and H level signal BB is applied to the first input terminal of 2-input OR circuit 16C which controls memory array 10C. Thus, the H level output signal from 2-input OR circuit 16C is applied to the first input terminal of 2-input AND circuit 14C, and common H level clock signal CLK2 is applied to the second input terminal thereof, so that memory array 10C is supplied with clock signal CLK 2 or the power supply, and changed from the inactive state to the active state.

That is, according to the configuration of the second variation of the first embodiment, data is sequentially written from memory array 10A to memory array 10D, but since it is more likely that memory array 10B is used after memory array 10A is used, memory array 10B is also activated to respond to the writing operation anytime.

Similarly, after memory array 10B has been actually used, memory array 10C is accordingly activated. After memory array 10C has been actually used, memory array 10D having a lowest priority is activated.

In this way, according to the second variation of the first embodiment, the memory array having the high priority next to the memory array which is being used at the present is activated, and the clock signal or the power supply can be stopped from being supplied to the other memory array, so that the power consumption can be efficiently reduced.

In addition, when the memory is designed normally, each designed circuit is repeatedly used many times, the configuration in the second variation of the first embodiment is provided, but as another configuration, 2-input OR circuit 16A may not be given and signal AA may be directly applied to the first input terminal of 2-input AND circuit 14A.

Second Embodiment

Figure 11:
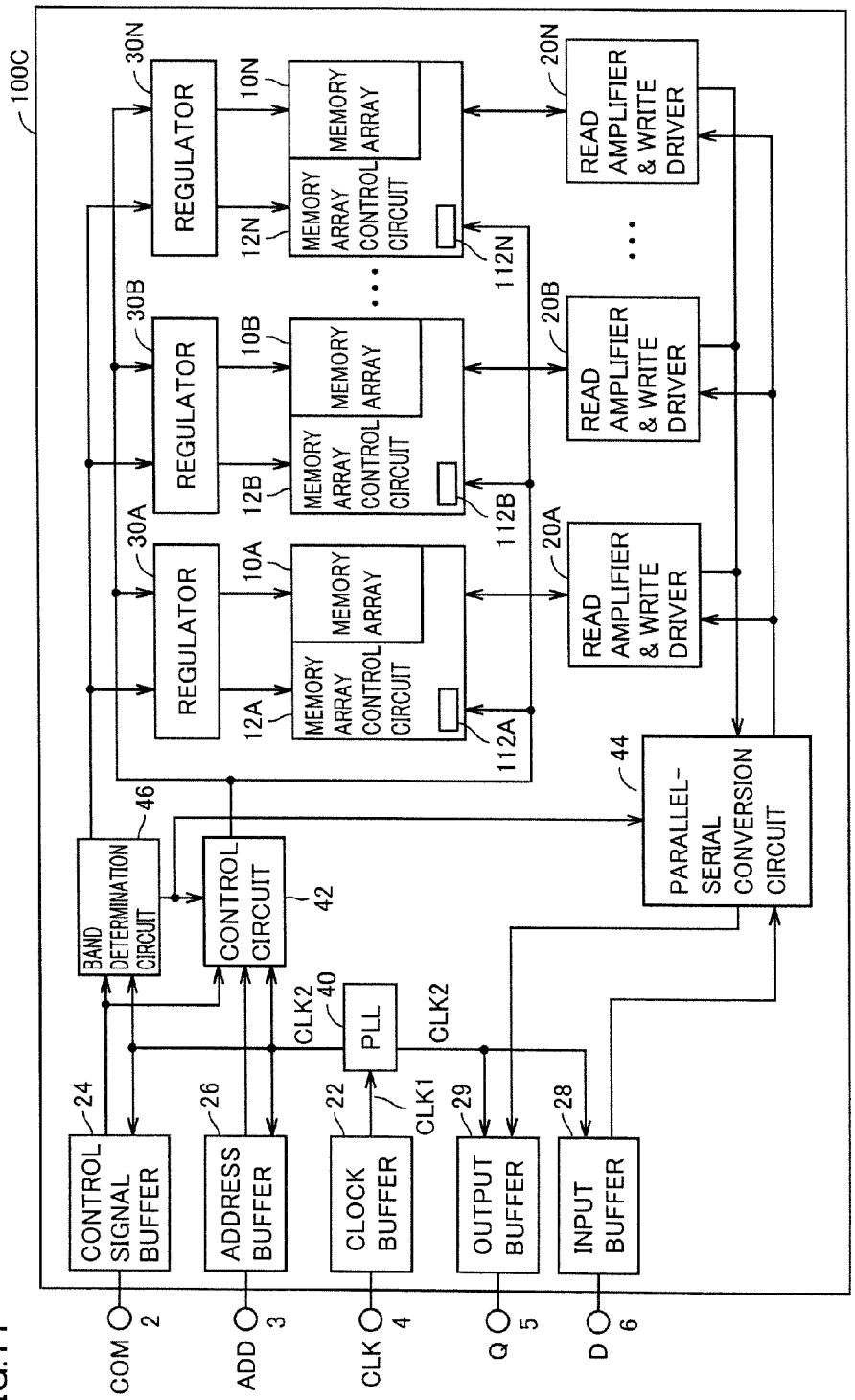
FIG. 11 is a block diagram schematically showing a configuration of a memory 100C of a second embodiment.

FIG. 11 is a block diagram schematically showing a configuration of a memory 100C in a second embodiment. Referring to FIGS. 2 and 11, memory 100C will be described, while making a comparison with memory 100 in the first embodiment.

According to memory 100C, a band determination circuit (band prediction) 46 is added to the configuration of memory 100. Band determination circuit (band prediction) 46 receives the output signal from control signal buffer 24, and clock signal CLK2 after the signal of the read command or write command is received from control signal terminal 2. Thus, a band of the command signal can be determined based on a command interval inputted from the external part. More specifically, in a case where the write command is generated in a short time, it is determined that the band is high. Contrarily, when the command interval is long, it is determined that the band is low.

Based on this band determination, the signal outputted from band determination circuit (band prediction) 46 is applied to control circuit 42, and parallel-serial conversion circuit 44 to select the memory array for storing the inputted data.

Figure 12:
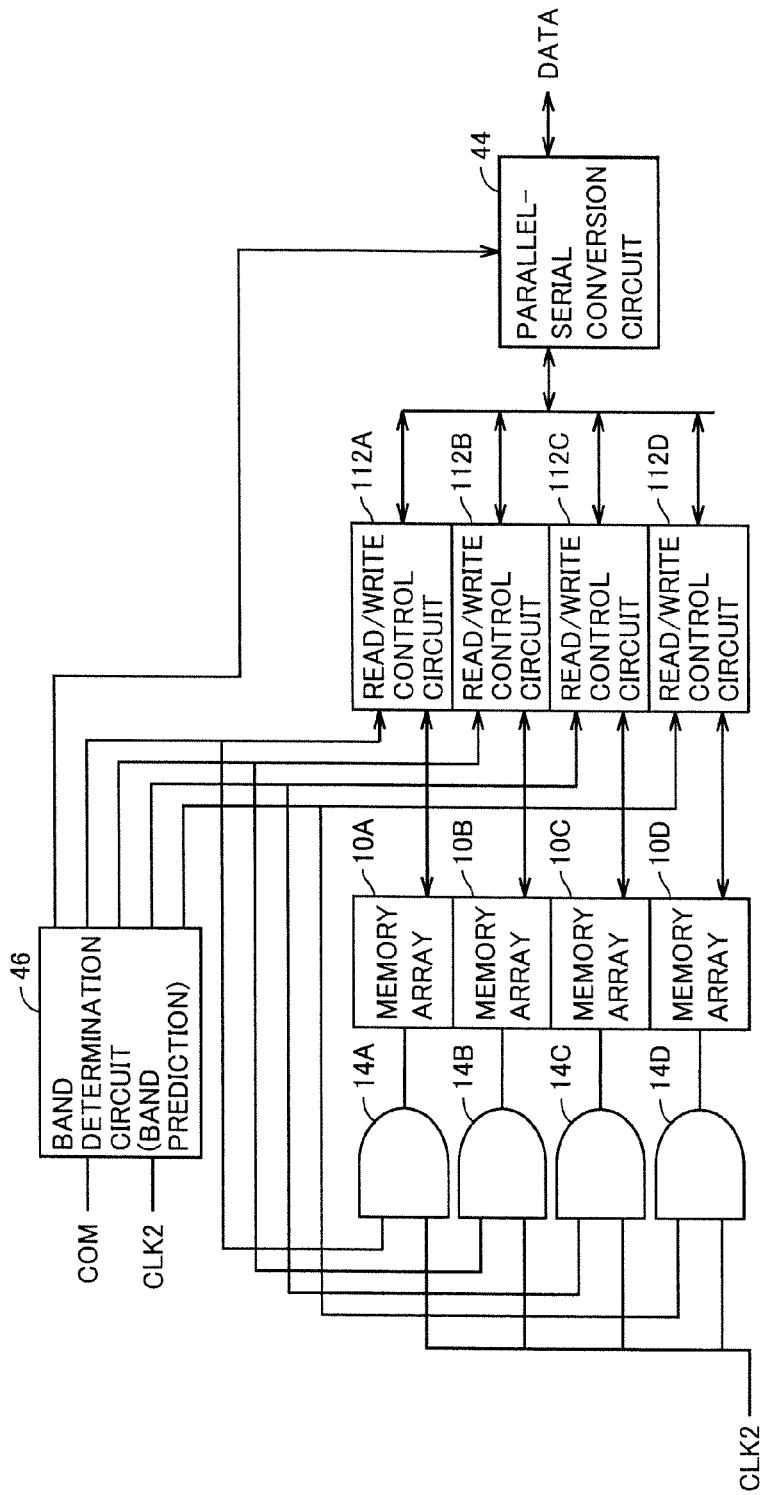
FIG. 12 is a schematic view to describe an operation of memory 100C of the second embodiment.

FIG. 12 is a schematic view to describe an operation of memory 100C in the second embodiment. To facilitate the description, a description will be given of memory arrays 10A to 10D similar to the first embodiment.

Referring to FIG. 12, band determination circuit (band prediction) 46 determines whether the band is high or low based on the command interval. When the band is high, in order to write the data in memory arrays 10A to 10D at the same time, the H level output signal from band determination circuit (band prediction) 46 is applied to the first input terminals of 2-input AND circuits 14A to 14D. On the other hand, clock signal CLK2 is applied to the second input terminals of 2-input AND circuits 14A to 14D. Thus, memory arrays 10A to 10D are selected to be activated. In addition, parallel-serial conversion circuit 44 is controlled by the output signal from band determination circuit (band prediction) 46, and executes parallel-serial conversion so that the data is inputted to memory arrays 10A to 10D.

Meanwhile, when the band is low, that is, when the data can be well enough written in only memory array 10A, the H level output signal of band determination circuit (band prediction) 46 is applied to the first input terminal of 2-input AND circuit 14A, and L level output signal of band determination circuit (band prediction) 46 is applied to the first input terminals of other 2-input AND circuits 14B to 14D. On the other hand, clock signal CLK2 is applied to the second input terminals of 2-input AND circuits 14A to 14D. Thus, only memory array 10A is selected so as to be activated, and other memory arrays 10B to 10D are selected so as to be inactivated. In addition, parallel-serial conversion circuit 44 is controlled by the output signal from band determination circuit (band prediction) 46, and executes parallel-serial conversion so that the data is inputted to memory array 10A.

In addition, parallel-serial conversion circuit 44 is not necessarily provided inside the memory device, and parallel-serial conversion circuit 44 may input data which has been parallel-serial converted in the external part.

According to this configuration, the necessary memory array is selected to be activated based on the height of the band, and the clock signal or the power supply is not supplied to the other memory arrays, so that the power consumption can be reduced. In addition, since other configuration is the same as that of the first embodiment, its description is not given.

Figure 13:
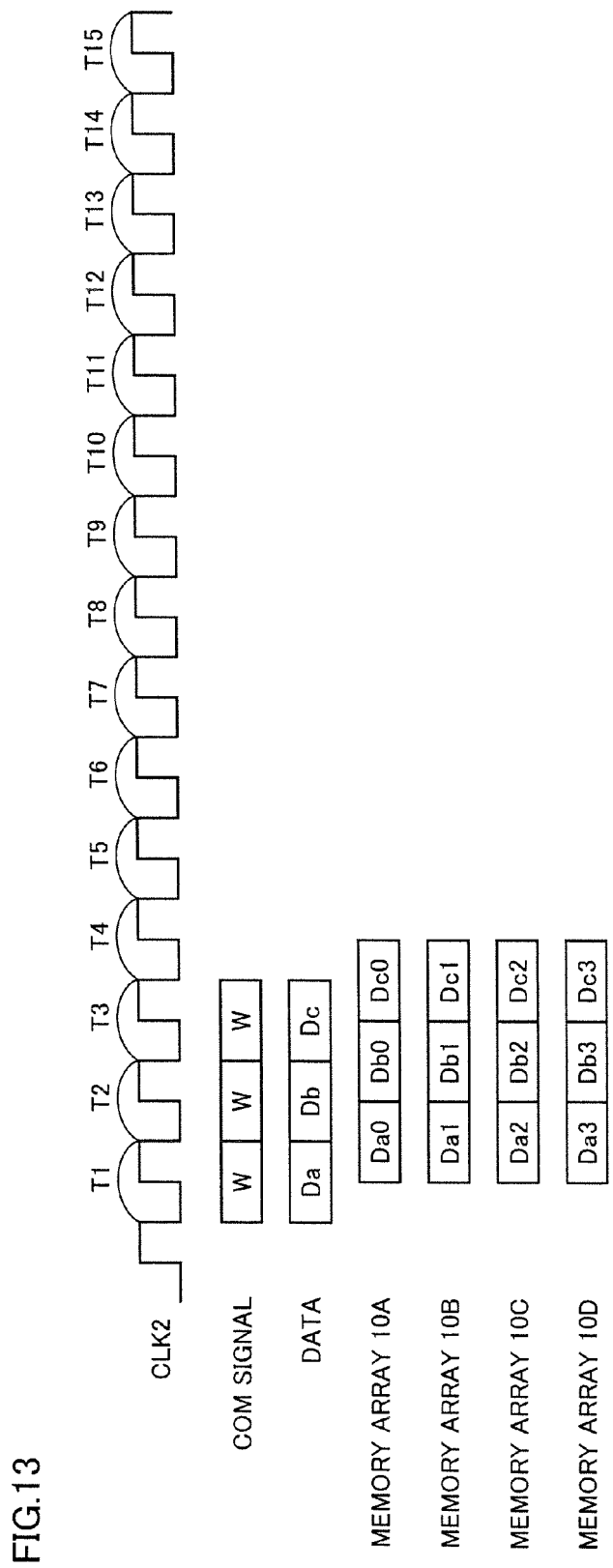
FIG. 13 is a timing chart to describe an operation when a band is high in the second embodiment.

FIG. 13 is a timing chart to describe the operation when the band is high in the second embodiment. Referring to FIG. 13, write commands W are sequentially inputted from control signal terminal 2, and write data Da, Db, and Dc corresponding to write commands W are inputted from data input terminal 6 at times T1 to T3.

Thus, since the write command signals are sequentially inputted in a short time, band determination circuit (band prediction) 46 determines that the band is high, and outputs the signal to control circuit 42 and parallel-serial conversion circuit 44.

In response to this output signal, each of memory arrays 10A to 10D is activated by control circuit 42, and parallel-serial conversion circuit 44, so that the write operation is performed at the same time.

More specifically, at time T1, write command W and its data Da are applied to control signal terminal 2 and data input terminal 6, respectively. Then, the same operation is performed at time T2 and time T3.

Thus, when write commands W are sequentially inputted in a short time, the clock signal or the power supply is supplied to memory arrays 10A to 10D, and memory arrays 10A to 10D are all selected to be activated. Thus, the data can be dispersed and written in memory arrays 10A to 10D uniformly, so that the write time can be shortened.

That is, at time T1, it is determined that memory arrays 10A to 10D are needed in order to write input data Da in a predetermined time, and data Da0 to Da3 provided by equally dividing data Da are written in memory arrays 10A to 10D, respectively. Then, the same operation is performed at time T2 and time T3.

Figure 14:
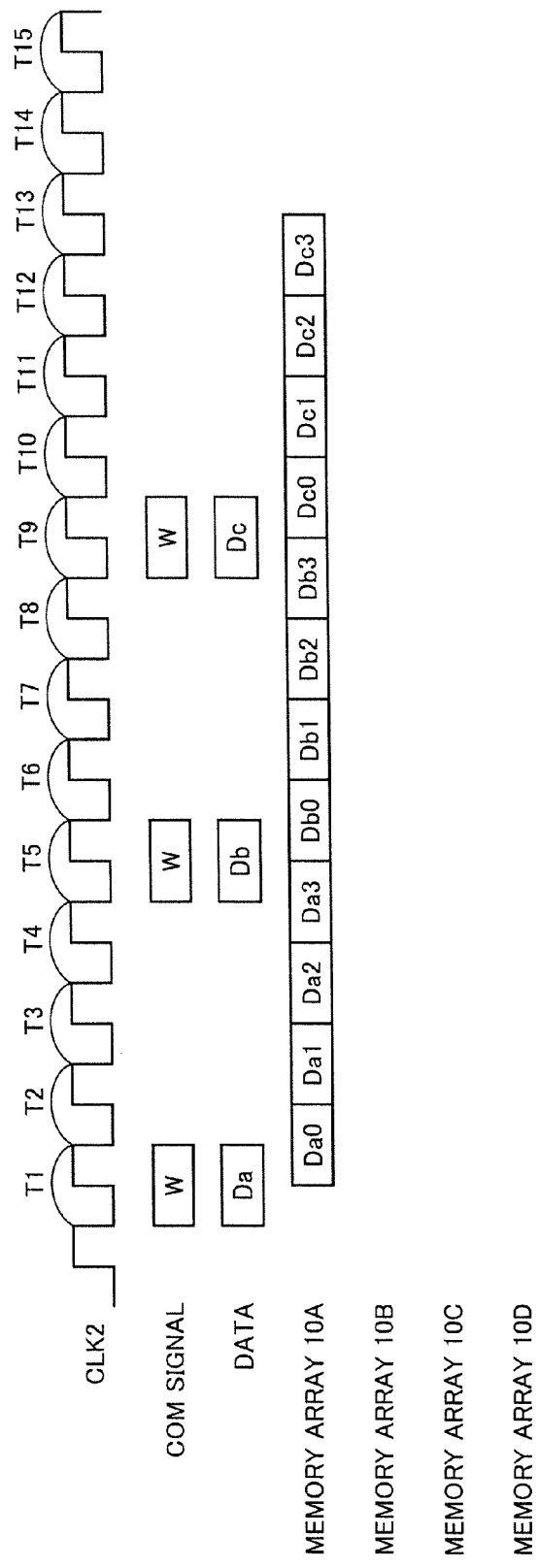
FIG. 14 is a timing chart to describe an operation when a band is low in the second embodiment.

FIG. 14 is a timing chart to describe an operation in the case where the band is low in the second embodiment. Referring to FIG. 14, write commands W are sequentially inputted from control signal terminal 2, and write data Da, Db, and Dc corresponding to write commands W are inputted from data input terminal 6 at times T1, T5, and T9.

Thus, while the write command signals are sequentially inputted, there is a time (command interval) to write each data in the memory cell before the next command is inputted, so that band determination circuit (band prediction) 46 determines that the band is low, and outputs the signal to control circuit 42 and parallel-serial conversion circuit 44.

In response to this output signal, memory array 10A is only selected so as to be activated, and other memory arrays 10B to 10D are selected so as to be inactivated by control circuit 42 and parallel-serial conversion circuit 44.

More specifically, at time T1, write command W and its data Da are applied to control signal terminal 2 and data input terminal 6, respectively. Then, the same operation is performed at time T2, and time T3.

Thus, commands W are sequentially inputted together with write data, but when the command interval is wide and it is not necessary to write the data at the same time, only memory array 10A is activated, and other memory arrays 10B to 10D are inactivated because the clock signal or the power supply is not applied thereto, so that the power consumption can be reduced.

That is, at time T1, it is determined that memory array 10A suffices to write inputted data Da in a predetermined time, and data is not written in other memory arrays 10B to 10D, and data Da0 to Da3 provided by dividing data Da are sequentially written in memory array 10A. Then, the same operation is performed at time T2 and time T3.

Figure 15:
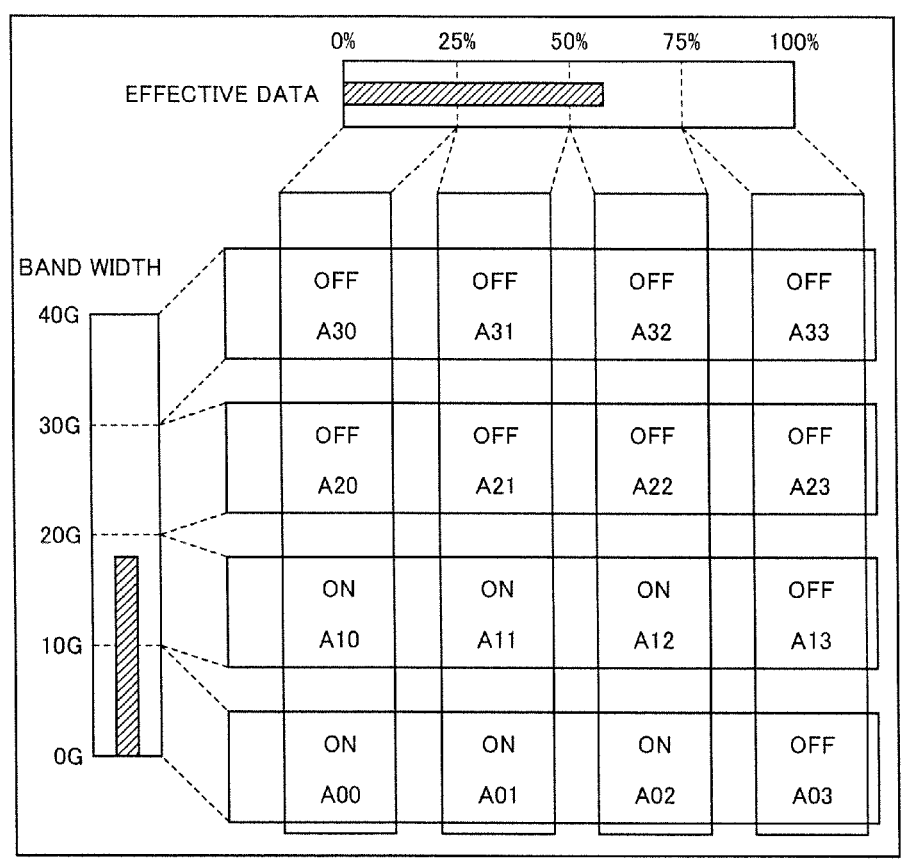
FIG. 15 is a view to describe one example of a state of the memory array in a relationship between a band width and effective data in the second embodiment.

FIG. 15 is a view to describe one example of a state of the memory array in a relationship between a band width and effective data in the second embodiment. In order to facilitate understanding, a description will be given of states of 16 memory arrays of memory arrays A00 to A33 based on the relationship between the band width and the effective data.

Referring to FIG. 15, a horizontal axis shows a ratio of the effective data inputted in the write operation, to entire memory capacity, and a vertical axis shows a band of the inputted command in the write operation. In addition, the effective data means data which will be read or could be read.

The description will be given of a case where the band of write command W is inputted within a range of 10 GHz to 20 GHz, and a ratio of data to be written is within a range of 50% to 75% to the entire data capacity. In this case, since the band is low, it is not necessary to increase the number of the memory arrays to write the data at the same time.

Therefore, by band determination circuit (band prediction) 46, memory arrays A00 to A02, and A10 to A12 are supplied with the clock signal or the power supply and selected so as to be activated (turned on) for the write operation. Meanwhile, the other memory arrays are not supplied with the clock signal or the power supply to be inactivated (turned off).

Thus, the clock signal or the power supply is not supplied to the memory arrays except for the memory array in which the effective data is stored, so that the power consumption is expected to be reduced.

Figure 16:
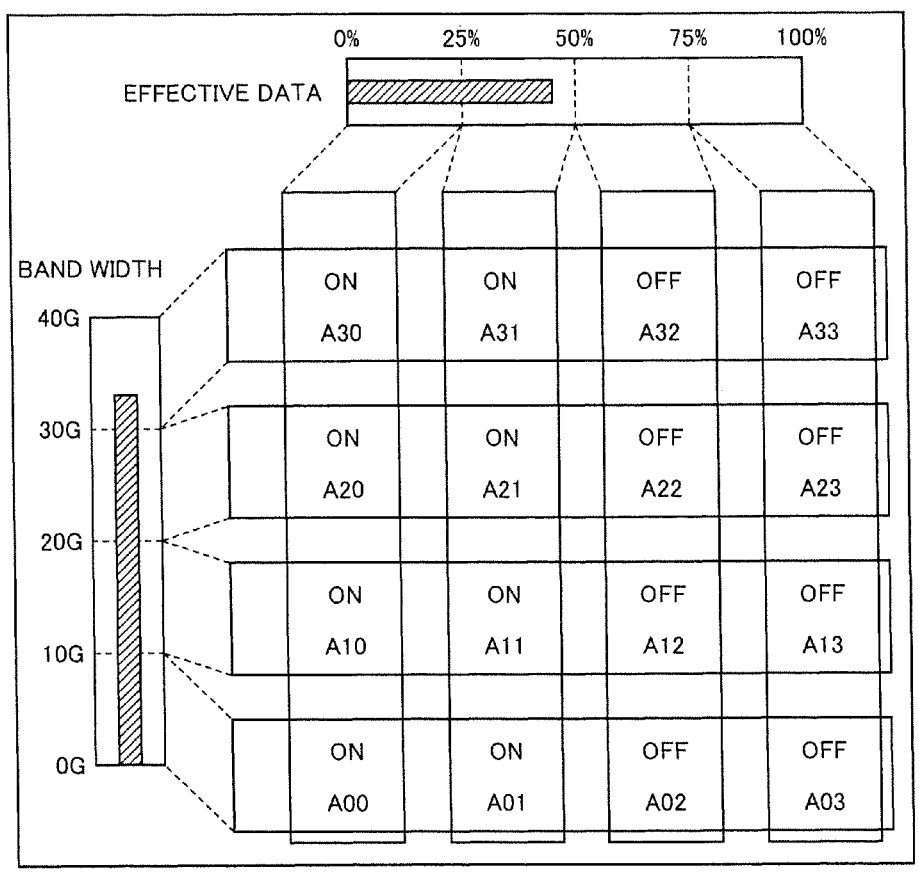
FIG. 16 is a view to describe another example of a state of the memory array in a relationship between a band width and effective data in the second embodiment.

FIG. 16 is a view to describe another example of the state of the memory array in the relationship between the band width and the effective data in the second embodiment. Similar to FIG. 15, in order to facilitate understanding, a description will be given of states of 16 memory arrays of memory arrays A00 to A33 based on the relationship between the band width and the effective data.

Referring to FIG. 16, a horizontal axis shows a ratio of the effective data inputted in the write operation, to entire memory capacity, and a vertical axis shows a band of the inputted command in the write operation. In addition, the effective data means data which will be read or could be read.

The description will be given of a case where the band of write command W is inputted within a range of 30 GHz to 40 GHz, and a ratio of data to be written is within a range of 25% to 50% to the entire data capacity. In this case, since the band is high, it is necessary to increase the number of the memory arrays to write the data at the same time.

Therefore, by band determination circuit (band prediction) 46, memory arrays A00 and A01, A10 and A11, A20 and A21, and A30 and A31 are supplied with the clock signal or the power supply and selected so as to be activated (turned on) for the write operation. Meanwhile, the other memory arrays are not supplied with the clock signal or the power supply to be inactivated (turned off).

Thus, the clock signal or the power supply is not supplied to the memory arrays except for the memory array in which the effective data is stored, so that the power consumption is expected to be reduced.

Finally, this embodiment will be summarized with reference to FIG. 1 again.

Referring to FIG. 2, the semiconductor device in the first embodiment includes memory arrays 10, and each memory array 10 includes memory cells. The semiconductor device further includes memory array control circuits 12. Each of memory array control circuits 12 includes read/write control circuit 112 to control the read/write operation to the memory array, and selection circuits 14 and 15 to select and activate memory array 10, based on the clock signal and the output signal from the read/write control circuit with respect to each memory array 10.

Preferably, referring to FIGS. 2 and 3, read/write control circuit 112 includes counter 114 which increments the counter number when the write command is inputted, and decrements the counter number when the read command is inputted, and determination circuit 116 to determine whether or not the effective data exists in the memory array, based on the count number of counter 114.

Preferably, referring to FIG. 7, as selection circuit 14, logic gates 14A, 14B, ..., are provided to receive the output signal from read/write control circuit 112 and the clock signal, and logic gates 14A, 14B, ..., supply the clock signal to memory array 10 when the output signal is activated.

Referring to FIGS. 11 and 12, the semiconductor device in the second embodiment includes band determination circuit 46 to determine the band based on the command interval of the command inputted to write the data in memory arrays 10, and control circuit 42 to determine memory arrays 10 in which the divided data are written at the same time, based on the output of band determination circuit 46, in addition to the configuration of the semiconductor device in the first embodiment.

In addition, referring to FIGS. 2 and 9, the semiconductor device in the first variation of the first embodiment includes memory arrays 10, and each of memory arrays 10 includes memory cells. The semiconductor device further includes memory array control circuits 12. First memory array control circuit 12A among memory array control circuits 12 includes first logic gate 14A to receive the clock signal and a fixed potential signal, and other memory array control circuits (12B to 12D) include read/write control circuits 112B to 112D to control the read/write operation for the memory arrays (10B to 10D), respectively, and second logic gates 14B to 14D to receive the output signals from read/write control circuits 112B to 112D and the clock signals, respectively. Second logic gates 14B to 14D supply the clock signals to memory arrays 10B to 10D, respectively when the output signal is activated.

In addition, referring to FIGS. 2 and 10, the semiconductor device in the second variation of the first embodiment includes memory arrays 10, and memory arrays 10 have respective priorities. Each of memory arrays 10 includes memory cells. The semiconductor device further includes memory array control circuits 12, and each of memory array control circuits 12 includes read/write control circuit 112 to control the read/write operation to memory array 10, and the logic gate (selection circuit 15) to control the memory array. The logic gates (AND circuit 14B and OR circuit 16B) in memory array control circuit 12B among memory array control circuits 12 receive the output signal from read/write control circuit 112B provided in memory array control circuit 12B, and the signal from read/write control circuit 112A corresponding to memory array 10A having the priority higher by one than memory array 10B corresponding to memory array control circuit 12B.

Furthermore, referring to FIGS. 1, 5, and 6, the semiconductor device in each embodiment further includes memory controller 200. Memory controller 200 includes address management circuit 201 to manage read address A0 which has been already read, and address management circuit 201 includes buffer memories 204, buffer memory specification circuit 202 to specify buffer memory 204 to store read address A0, and write address determination circuit 206 to determine write address A1 required at the time of write operation by sequentially referring to buffer memories 204.

According to this embodiment, the memory array is activated/inactivated based on the presence of the effective data, and clock signal or the power supply is not applied to the inactivated memory array, so that the power consumption can be reduced.

As described above, the above embodiments may be combined. When they are combined, the power consumption can be reduced and the memory can be efficiently used.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
    a plurality of memory arrays, and
    a plurality of memory array control circuits,
    each of said plurality of memory array control circuits including:
        a read/write control circuit for controlling a read/write operation to the memory array, and
        a selection circuit for selecting and activating the memory array based on a clock signal and an output signal from said read/write control circuit,
    wherein
    said read/write control circuit includes:
    a counter for incrementing a count number when a write command is inputted, and decrementing said count number when a read command is inputted, and
    a determination circuit for determining whether or not effective data exists in said memory array, based on said count number of said counter.

2. The semiconductor device according to claim 1, wherein said selection circuit includes a logic gate receiving the output signal from said read/write control circuit and said clock signal, and said logic gate supplies said clock signal to the memory array when said output signal is activated.

3. The semiconductor device according to claim 1, wherein
    said semiconductor device further comprises a memory controller,
    said memory controller includes an address management circuit for managing a reading-completed read address, and
    said address management circuit having:
    a plurality of buffer memories, a buffer memory specification circuit for specifying the buffer memory to store said read address from the plurality of buffer memories, and a write address determination circuit for determining a write address required at the time of the write operation by sequentially referring to said buffer memories.

4. A semiconductor device comprising:

a plurality of memory arrays, and a plurality of memory array control circuits, each of said plurality of memory array control circuits including:

a read/write control circuits for controlling a read/write operation to the memory array, and a selection circuit for selecting and activating the memory array based on a check clock signal and an output signal from said read/writes control circuits, wherein said semiconductor device includes:

a band determination circuit for determining a band based on a command interval of a command inputted to write data in said plurality of memory arrays; and a control circuit for determining said plurality of memory arrays to write said data at the same time in a dispersed manner, based on an output of said band determination circuit.

5. A semiconductor device comprising:

a plurality of memory arrays, and a first memory array control circuit among a plurality of memory array control circuits includes a first logic gate for receiving a clock signal and a fixed potential signal, each of said plurality of other memory array control circuits including:

a read/write control circuit for controlling a read/write operation to the memory array, and a second logic gate for receiving an output signal from said read/write control circuit and said clock signal, and said second logic gate supplying said clock signal to the other memory array when said output signal is activated.

6. The semiconductor device according to claim 5, wherein said semiconductor device further comprises a memory controller, said memory controller includes an address management circuit for managing a reading-completed read address, and said address management circuit having:

a plurality of buffer memories, a buffer memory specification circuit for specifying the buffer memory to store said read address from the plurality of buffer memories, and a write address determination circuit for determining a write address required at the time of the write operation by sequentially referring to said buffer memories.

7. A semiconductor device comprising:

a plurality of memory arrays, wherein each of said plurality of memory arrays is assigned a priority, and a plurality of memory array control circuits provided so as to correspond to said plurality of memory arrays, each of said plurality of memory array control circuits including:

a read/write control circuit for controlling a read/write operation to the corresponding memory array, and a selection circuit having a logic gate for controlling the corresponding memory array, wherein:

said read/write control circuit is configured to output a control signal with a first logic value when the corresponding memory array has effective data;

said logic gate is configured the corresponding memory array responsive to the control signal, the plurality of memory array control circuits includes a first memory array control circuit corresponding to a first memory array among the plurality of memory arrays and a second memory array control circuit corresponding to a second memory array among the plurality of memory arrays, the second memory array having one level of priority higher than a priority level of the first memory array, the first memory array control circuit includes a first logic gate and a first read/write control circuit and the second memory array control circuit includes a second logic gate and a second read/write control circuit, the first logic gate is configured to receive a first control signal from the first read/write control circuit, and a second control signal from the second read/write control circuit corresponding to the second memory array having the one level of priority higher than the priority level of the first memory array corresponding to said first memory array control circuit, and the first logic gate provided in the first memory array control circuit activates the first memory array when the first control signal has the first logic value or the second control signal has the first logic value.

8. The semiconductor device according to claim 7, wherein said semiconductor device further comprises a memory controller, said memory controller includes an address management circuit for managing a reading-completed read address, and said address management circuit having:

a plurality of buffer memories, a buffer memory specification circuit for specifying the buffer memory to store said read address from the plurality of buffer memories, and a write address determination circuit for determining a write address required at the time of the write operation by sequentially referring to said buffer memories.

* * * * *

UNITED STATES PATENT AND TRADEMARK OFFICE
CERTIFICATE OF CORRECTION

| | |
|---|---|
| PATENT NO. | : 9,135,966 B2 |
| APPLICATION NO. | : 13/566779 |
| DATED | : September 15, 2015 |
| INVENTOR(S) | : Hisashi Iwamoto, Yuji Yano and Kazunari Inoue |

It is certified that error appears in the above-identified patent and that said Letters Patent is hereby corrected as shown below:

In the claims, at col. 16, line 14,

"said logic gate is configured the corresponding memory"

should read:

-- said logic gate is configured to activate the corresponding memory --

Signed and Sealed this
Twenty-eighth Day of June, 2016

Michelle K. Lee
*Director of the United States Patent and Trademark Office*